(12) United States Patent
Hahn et al.

(10) Patent No.: US 7,053,313 B2
(45) Date of Patent: May 30, 2006

(54) TRANSPARENT SUBSTRATE PROVIDED WITH ELECTROCONDUCTIVE STRIPS

(75) Inventors: Dieter Hahn, Ubach-Palenberg (DE);
Josef Switalla, Ubach-Palenberg (DE);
Rainer Kummutat, Herzogenrath (DE);
Andre Beyrle, Tracy-le-Val (FR);
Yannick Lebail, Chevincourt (FR)

(73) Assignee: Saint-Gobain Glass France, Courbevoie (FR)

( * ) Notice: Subject to any disclaimer, the term of this patent is extended or adjusted under 35 U.S.C. 154(b) by 276 days.

(21) Appl. No.: 10/257,439

(22) PCT Filed: Apr. 17, 2001

(86) PCT No.: PCT/FR01/01175

§ 371 (c)(1),
(2), (4) Date: Jul. 7, 2003

(87) PCT Pub. No.: WO01/80608

PCT Pub. Date: Oct. 25, 2001

(65) Prior Publication Data

US 2004/0031146 A1 Feb. 19, 2004

(30) Foreign Application Priority Data

| Apr. 14, 2000 | (DE) | 100 18 902 |
| Aug. 9, 2000 | (DE) | 100 38 768 |
| Nov. 16, 2000 | (DE) | 100 56 777 |
| Dec. 13, 2000 | (FR) | 00/16199 |

(51) Int. Cl.
*H05K 1/09* (2006.01)
*H05K 1/11* (2006.01)
*H05K 3/20* (2006.01)
*H05B 3/10* (2006.01)
*B60L 1/02* (2006.01)
*B05D 5/12* (2006.01)

(52) U.S. Cl. ............... 174/256; 174/257; 219/203; 219/547; 219/548; 427/108; 427/163.1; 427/164; 427/165; 427/259; 427/282

(58) Field of Classification Search ........... 219/203, 219/547, 548
See application file for complete search history.

(56) References Cited

U.S. PATENT DOCUMENTS

| 3,813,519 A | * | 5/1974 | Jochim et al. ............ 219/522 |
| 3,830,651 A | * | 8/1974 | Minneman et al. ...... 106/1.13 |
| 3,832,527 A | * | 8/1974 | Nagasima ................ 219/522 |
| 3,852,564 A | * | 12/1974 | Baum et al. ............. 219/522 |
| 4,102,722 A | * | 7/1978 | Shoop ...................... 156/99 |
| 4,971,848 A | * | 11/1990 | Ruelle et al. .............. 428/38 |
| 5,824,993 A | * | 10/1998 | Chrysochoos et al. .... 219/203 |

FOREIGN PATENT DOCUMENTS

| DE | 1796310 | 11/1964 |
| DE | 32 31 386 A1 | 3/1984 |
| DE | 35 06 891 A1 | 8/1986 |
| EP | 0 079 854 | 5/1983 |
| EP | 0 193 464 | 9/1986 |

* cited by examiner

*Primary Examiner*—John B. Vigushin
(74) *Attorney, Agent, or Firm*—Oblon, Spivak, McClelland, Maier & Neustadt, P.C.

(57) ABSTRACT

The present invention relates to a method of manufacturing electrically conducting tracks on a transparent substrate, by screen printing with an electrically conducting paste, and to the transparent substrate provided with said tracks.

According to the invention, conducting tracks are formed with a width less than or equal to 0.3 mm by applying, by screen printing, a thixotropic electrically conducting paste having a ratio of the viscosity without shear stress to the viscosity under shear stress under screen-printing conditions of at least 50 and having a silver content greater than 35% and of which at least 98% of the particles which form it have a size less than 25 μm, by means of a screen having at least 90 threads per cm, the coating of said screen being provided with slots, the narrowest width of which is equal to 0.25 mm±0.05 mm, and by subjecting said tracks to baking.

15 Claims, No Drawings

TRANSPARENT SUBSTRATE PROVIDED WITH ELECTROCONDUCTIVE STRIPS

CROSS-REFERENCE TO RELATED APPLICATIONS

This application is a U.S. National Stage of International Application No. PCT/FR01/01175, filed Apr. 17, 2001.

FIELD OF THE INVENTION

The invention relates to a method of manufacturing electrically conducting tracks on a transparent substrate, by screen printing with an electrically conducting paste, and to the transparent substrate provided with said tracks.

BACKGROUND OF THE INVENTION

For several years already, it has been known to fit transparent substrates, especially glazing panels, with conducting tracks which can act as heating elements or as antenna or alarm elements.

These tracks are generally obtained by the screen-printing method using a paste containing metallic silver particles. It is known from EP-A-0 712 814 that the paste has a high silver content, that is to say from 60 to 90% by weight of the solid material. Moreover, EP-A-0 079 854 describes a paste, capable of being deposited by screen printing on glass, which comprises from 45 to 90% by weight of metallic silver particles with a size less than 1 µm.

The electrically conducting tracks may also be obtained by methods other than screen printing, for example by extruding a conducting thermosetting paste directly on the glass in order to form narrow wires (see DE-A-1 796 310).

The electrically conducting tracks which are obtained after baking (which baking is generally carried out at the same time as treating the glazing panels for forming and/or toughening purposes) have sufficient mechanical strength. As a result, the additional galvanizing step, which is tricky to implement because of the pollution risks associated therewith, is avoided.

Glazing panels comprising electrically conducting tracks are very widespread in the automobile field. Most often, these tracks are employed as heating tracks, especially on rear windows, but they can also be placed on the glazing panel to provide it with an alarm and/or antenna functions. The aforementioned documents give no indication with regard to the width of the electrically conducting tracks thus produced. In practice, electrically conducting tracks are formed in industry by conventional screen printing and, after baking, they have a width of between 0.4 and 1.2 mm and a thickness which varies according to the nominal heating power and the ohmic resistance per unit area in question.

Because of the beneficial functions provided by these tracks, their number on one and the same glazing panel has tended to increase over the years, which could pose problems of overall size and of visibility. Thus, when the tracks are located in the field of vision of the glazing panel, they are clearly visible from the inside, which may bother the driver, and secondarily from the outside, which is detrimental to the esthetic appearance of the vehicle.

Moreover, it is already known to use screen-printing stencils to form varied patterns on the glass (see DE-A 32 31 382 and DE-A-35 06 891). Thus it is also possible to apply the paste in a thicker and/or wider layer at certain locations of the glass in a single step (without multiple printing), for example in order to form busbars for the electric current of the heated glazing panels. In this way, it is possible for the temperature over the entire glazed surface to be adjusted as well as possible, this temperature not having to exceed 50° C. in the region of the busbars under standard ambient temperature conditions for a heating power going up to 450 watts. The examples appearing in the aforementioned patent applications are produced with a d.c. voltage commonly employed for automobiles, of about 11 to 14 volts.

Heated glazing panels and glazing panels with antenna, the conducting tracks of which consist of fine tungsten wires with a diameter of a few micrometers, are also known. These wires are only present on laminated glazing panels and they are embedded within the adhesive forming the intermediate sheet since otherwise it is not possible for them to be fastened safely directly onto the glass. Since they are finer, these wires are consequently less visible than the conducting tracks obtained by screen printing.

There is a requirement by automobile manufacturers, especially for top-of-the-range vehicles, to have available glazing panels made of toughened or laminated safety glass provided with conducting tracks which are barely visible to the naked eye.

SUMMARY OF THE INVENTION

The aim of the present invention is to form conducting tracks on a transparent substrate which, while being narrower than the known tracks, are capable of fulfilling the electrical conduction function which is assigned to them.

This aim is achieved by the method of the invention which consists in forming electrically conducting tracks on the surface of a transparent substrate, by applying, by screen printing, an electrically conducting paste forming a predetermined pattern, and in subjecting said tracks to baking, said method being characterized in that a thixotropic paste is used, having a silver content greater than 35% and of which at least 98% of the particles which form it have a size less than 25 µm, and a screen having at least 90 threads per cm, the width of the narrowest printed individual electrically conducting track being less than or equal to 0.3 mm.

To obtain the electrically conducting tracks having the required width, it has proved to be important to carefully control all the elements of the method according to the invention. In this respect, quite particular attention should be paid to the properties of the paste, especially the thixotropy and the size of the particles forming it, and to the screen parameters, especially the mesh size, the thickness of its coating and the width of the openings (in this case, slots) to be provided in said coating which corresponds directly to the width of the tracks to be printed by screen printing. By virtue of the invention, it is possible to mass produce glazing panels fitted with a predetermined pattern of particularly fine tracks which are barely visible to the naked eye, on an industrial scale.

The opening of the meshes and also the size of the openings or of the slots provided in the screen coating for printing said pattern on the surface of a glazing panel have a direct effect on the width of said tracks. Given that the size of the slots corresponds substantially to the width of the tracks obtained, it is necessary to form extremely narrow slots (as a general rule, of about 0.25 mm±0.05) in said coating which itself is relatively thin. Nevertheless, the width of one of these slots may extend over more than one single mesh of the screen.

However, it cannot be excluded that there are other possibilities of producing narrow tracks by another method using a less thixotropic paste, a coarser screen (for example consisting of about 70 threads per cm), a relatively thick screen coating, etc.

In spite of the narrowness of said tracks, which it is barely possible to detect, a heating power comparable to that of the normal screen-printed heating tracks or regions is obtained. Nevertheless, the thickness of the tracks, although increased, is kept within acceptable limits. The tracks obtained using the method described herein thus have a maximum thickness on the glass surface, measured after baking, of about 35 μm, more generally about 15 to 25 μm, although the thickness of conventional tracks is about 12 μm. This larger maximum thickness may be obtained inter alia by virtue of highly thixotropic pastes used according to the invention which have the ability to recover their initial viscosity very quickly after printing on the glass.

By virtue of the method according to the invention, it is therefore possible to significantly reduce the width or the dimensions of the individual electrically conducting tracks by applying, by printing, a thixotropic paste containing at least 35% by weight of silver, having good flow properties for a high shear rate and containing very small particles, by means of a particularly fine screen, consisting of threads of a material known per se, arranged such that the opening of the mesh is small.

The importance attached to the thixotropic nature of the paste for the purpose of its application by screen printing should be specified. During application, the shear stress to which the paste is subject is high enough to cause a considerable and sudden drop in the viscosity which makes it possible for the paste to go through the orifices of the screen and be deposited on the substrate thereby forming the pattern of the tracks. Pastes which are suitable for this purpose are defined by a ratio of the viscosity in the absence of shear (starting viscosity) to the viscosity under shear stress (under screen-printing conditions) which varies from 50 to 1000 or even more, for example up to 1300–1500. By way of comparison, this ratio is between 2 and 10 for the normal screen-printing pastes.

It is also important that, after deposition on the substrate, the paste regains a viscosity value as close as possible to the starting value in a very short time (recovery time), but also that this value remains stable over time. In this way, the drawbacks connected with plastic flow of the paste, in particular an increase in the width and a decrease in the thickness of the printed tracks, are avoided, drawbacks which become greater, the greater the thickness of paste deposited. In general, a paste whose recovery time is less than one second, preferably of the order of a few tenths of a second, should be chosen.

With a paste which is less thixotropic or comprising coarser particles, it is not possible to obtain conducting tracks having the indicated width, since the paste cannot pass through the narrow openings of the screen. Furthermore, it is not possible either to envision producing narrow conducting tracks with a paste whose recovery time (or transition time between the virtually fluid state under shear and the normal, practically solid state) is too high to allow the tracks to remain stable immediately after removing the screen.

When the silver content of the paste is greater than 50%, the tracks whose width is less than 0.25 mm can be used as heating tracks, without increasing the temperature at the nominal permissible power. The tracks whose silver content is lower, for example of the order of 35%, are used rather as an alarm and/or an antenna.

The combined use of a thixotropic paste consisting of very small-sized particles and of a screen with a fine mesh makes it possible to print conducting tracks with excellent resolution. Furthermore, by increasing the silver content in the thixotropic paste, it is possible to reduce the final thickness of the tracks.

Although particularly suitable for silver-based pastes, the invention may be extended to pastes containing metal particles capable of meeting the required electrical conduction criteria, such as copper or gold particles.

The glazing panels obtained according to the method of the invention, although being provided with narrower tracks, have electrical conduction properties comparable to those of a glazing panel fitted with tracks obtained by conventional screen printing, all other things being equal (number of tracks, distance between the tracks, arrangement, etc.). In the case especially of heated glazing panels, a similar heating power is attained with the same number of tracks.

To a great extent, the method according to the invention makes it possible to overcome the restrictions which mean having to vary the cross section of the tracks according to where they are located on the glazing panel. Such a restriction exists, for example, on trapezoidal-shaped glazing panels where the tracks located on the upper part are shorter than those of the lower part, which requires adapting the cross section of the tracks so as to maintain a comparable heating power over the entire surface of the glass. This restriction is found with glazing panels where maximum heating power is sought in the region corresponding to the driver's field of vision. In this case, the conducting tracks have a greater width in the vicinity of the side edges than in the center of the glazing panel. By proceeding under the conditions of the invention, it is possible to form tracks of identical width without it resulting in a noticeable difference in the uniformity of the heating power. In this respect, there are grounds to think that the decrease in the electrical resistance results from the fact that the paste has a high silver content and that it is deposited over a larger thickness. The maximum permissible temperature values of the busbars are broadly respected without there being any need to apply a large thickness of screen-printing paste with a high conductivity. Most often, the temperature close to the busbars is 15% less than the maximum permitted temperature and does not exceed 50° C., under standard ambient temperature conditions, for a nominal power not exceeding 450 watts for a supply voltage of 11 to 14 volts.

Production on an industrial scale of the glazing panels obtained according to the method of the invention makes it possible to save on screen-printing paste, in particular when the latter is rich in silver (content greater than or equal to 80%). This is true for the production of heating tracks and even more so when it involves tracks intended to operate as an alarm and/or antenna.

DETAILED DESCRIPTION OF THE PREFERRED EMBODIMENTS

According to a first preferred embodiment, a thixotropic paste having a silver content greater than 35%, preferably 50% and even better 70%, the majority (at least 98%) of whose constituent particles have a size less than 25 μm, preferably 12 μm, is used together with a screen-printing screen having at least 90 threads per cm and a coating thickness of at least 30 μm, preferably 50 to 100 μm. This way of operating makes it possible to deposit on the substrate, by printing, in a single pass, a thickness of screen-printing paste which is relatively high compared with the thicknesses which are usually obtained. The deposits thus obtained have, after baking, a thickness less than 35 µm, more generally of the order of 15 to 25 µm.

The screen employed within the scope of this embodiment has a coating thickness which is greater (more than 30 µm) than that of the screens with an equivalent number of threads used for the intended application (generally less than 10 µm). This screen can be obtained by photographic technology, known per se, which consists in covering the surface of the screen with a layer or a film of photocrosslinkable resin and in operating by projecting a slide in order to reproduce the printing pattern on the screen. In the present case, a presensitized photocrosslinkable resin is used, which is capable of forming a coating which is solid enough to withstand the action of the screen-printing doctor blade, in a very short time, of the order of 150 seconds or even less. By way of comparison, with a conventional photocrosslinkable resin, it is necessary to have a high irradiation time, of the order of 5 to 6 minutes in order to obtain crosslinking throughout the thickness of the coating. The term "presensitized photocrosslinkable resin" refers in this case to a precrosslinked resin which comprises one or more polymers of low molecular weight capable of reacting under the effect of light in order to form a crosslinked network. The presensitized photocrosslinkable resin can especially be used in the form of a layer of emulsion deposited directly on the screen or of a film supporting said resin, this film being moistened before being applied to the surface of the screen. By limiting the irradiation duration, it is thus possible to prevent unwanted light effects close to the edges of the printing mask, light which causes undesirable crosslinking of the resin. This results in a reduction in the size of the printed pattern with respect to that of the mask, on the face subjected to the irradiation, which then results, during screen printing, in reducing the amount of paste deposited on the substrate and in poorer resolution in the printing of the tracks.

It is advantageous to choose a screen whose edges, corresponding to the printing patterns, are substantially parallel within the thickness such that the opening designed for the passage of the paste remains substantially constant from one face to the other of the screen. In any case, it is desirable that the variation of the opening between both faces of the screen, for the same pattern, is less than 20%, and preferably 10%. By way of comparison, with the previously mentioned conventional photocrosslinkable resin, the high irradiation time needed for the crosslinking does not allow the desired opening corresponding to the printed pattern to be obtained (reduction of the opening or even complete blockage).

The type of thread forming the screen is not critical. Preferably, the threads are made of polyester and each thread consists of a single (monofilament) thread with a diameter of between 30 and 60 µm, preferably 40 and 50 µm.

The doctor blade, which allows the paste to be pressed through the screen-printing screen, may be a normal doctor blade having a right-angled printing edge, which is chamfered or rounded. The use of the latter type of doctor blade makes it possible to obtain some increase in the shear stress, hence a reduction in the viscosity of the paste during passage through the screen. Preferably, the doctor blade consists of a material of the polymer type, for example a polyurethane, having a Shore A hardness of between 65 and 85.

By virtue of the invention, it is possible to obtain conducting tracks having a surface resistance less than 2.5 mohm per square for a thickness of 10 µm after baking, which corresponds to a resistivity less than 2.5 µohm.cm.

Furthermore, the conducting tracks have a satisfactory abrasion resistance, even where their thickness is high. This is attributed to the higher densification of the silver particles in the paste during baking.

The manufacture of a heated glazing panel for the purpose of use as a rear heated window of a motor vehicle is described below.

Thixotropic screen-printing paste contains 80% silver, 4% glass frit and 16% of a medium which has the function of facilitating application to the substrate. All the particles contained in the paste have a size less than 15 µm. The ratio of the viscosity without shear stress to the viscosity under shear stress under screen-printing conditions is equal to 200.

The screen consists of a 100 T fabric marketed by SEFAR which contains 100 threads per cm, each thread consisting of a single polyester thread having a diameter of 40 µm, and has a mesh opening equal to 58 µm. The screen is covered with a layer of presensitized photocrosslinkable emulsion with a thickness of 80 µm and the pattern corresponding to the printing mask is reproduced on the screen by photographic technology (irradiation time: 150 seconds; blade power: 7 000 W). The edges of the coating for the patterns reproducing the tracks are parallel, which means that the opening for the passage of the paste is constant from one face to the other of the screen.

The screen pattern is printed on a sheet of glass by means of a right-angled polyurethane doctor blade with a Shore A hardness of 85. With a printing speed of 20 m/min and an off-contact of 8 mm, tracks are formed which, after a baking cycle (from ambient temperature to 650° C. in 150 s), have a width of 0.2 to 0.22 mm and a thickness of 15 µm. The glazing panel fitted with current busbars has the same performance in terms of strength and heating power as a glazing panel having an identical number of conducting tracks, placed in the same way, obtained by conventional screen printing (width greater than 0.5 mm).

The manufacture of a heated glazing panel according to another variant of the invention, but also intended for use as a heated rear window of a motor vehicle, will be described below.

Although the normal doctor blades have a right-angled pointed printing edge, with which the paste is printed through the screen on the surface placed thereunder, it has proved to be preferable for embodying the invention to use a modified printing edge of the doctor blade providing a certain wedge effect. An explanation for this effect, resulting from chamfering or rounding said printing edge for this specific configuration, has not yet been found, but it is possible to assume that there is a reciprocal effect with the thixotropy—that is to say the reduction in viscosity on increasing the shear stress exerted on the thixotropic medium—of the screen-printing paste.

The rate of printing by the doctor blade is slightly less compared with the normal methods because of the need to make the paste pass through the slots or the openings of considerably smaller cross sections compared with the cross sections of known screen coatings. Furthermore, the off-contact of the screen (that is to say the distance between the freely tensioned screen and the substrate to be printed, in this case the glazing panel) is set at 10 mm.

With these materials and dimensions, a resistivity less than 2.5 µ*cm can be obtained after baking.

The product H 669, from DuPont, is used as a paste, the viscosity of which is equal to 17 Pa.s (pascal.sec). It only contains particles of a size less than or equal to 10 µm. It has a ratio of the viscosity without shear stress to the viscosity under shear stress under screen-printing conditions, equal to 100.

The screen consists of a 95 T fabric, marketed by SAATI S.p.A., Italy, which contains 95 threads per cm, each thread consisting of a single thread made of polyester having a diameter of 40 μm, and has a mesh opening equal to 65 μm. The screen is covered with a layer of presensitized photocrosslinkable emulsion with a thickness of about 16 μm and the pattern corresponding to the printing mask is reproduced on the screen by photographic technology. The edges of the coating at the patterns reproducing the tracks are parallel which means that the opening for the passage of the paste is constant from one face to the other of the screen. The narrowest of the slots formed in the coating have a width of about 250 μm.

The screen pattern is printed on a sheet of glass by means of a polyurethane doctor blade, whose edge is provided with a bevel at 45° over 0.2 mm and with a Shore A hardness of 65. With a printing speed of 0.35 m/sec and an off-contact of 10 mm, tracks are formed which, after a baking cycle (from ambient temperature to 650° C. in 150 s) have a width of 0.2 to 0.22 mm and a thickness of 12–15 μm. The glazing panel fitted with current busbars has the same performance in terms of resistance and heating power as a glazing panel having an identical number of conducting tracks, arranged in the same way, obtained by conventional screen printing (width greater than 0.5 mm).

The invention claimed is:

1. A method of manufacturing electrically conducting tracks on a substrate comprising:
   (i) applying a thixotropic paste to the surface of the substrate through a screen provided with a coating to provide a pattern of electrically conducting tracks having a width of less than or equal to 0.3 mm; and
   (ii) heating the electrically conducting tracks,
   wherein the thixotropic paste has a ratio of viscosity without shear stress to viscosity under shear stress of at least 50:1, the electrically conducting tracks have a silver content greater than 35%, and the coating comprises slots having a width of less than 0.25 mm±0.05 mm.

2. The method of claim 1, wherein the paste comprises particles, 98% of which have a particle diameter of not more than 25 μm and wherein the screen comprises at least 90 threads/cm.

3. The method of claim 1, wherein the paste has a silver content greater than 50% and comprises particles, at least 98% of which have a particle diameter of less than 12 μm.

4. The method of claim 1, wherein the screen comprises at least 95 threads/cm and wherein the electrically conducting tracks have a width less than 0.25 mm.

5. The method of claim 1, wherein the coating has a thickness of at least 10 μm.

6. The method of claim 5, wherein the thickness is at least 30 μm.

7. The method of claim 6, wherein the thickness is between 50 and 100 μm.

8. The method of claim 1, wherein the coating has walls that are substantially parallel throughout the thickness of the screen coating.

9. The method of claim 1, wherein the coating comprises a presensitized photocrosslinkable resin that has been irradiated.

10. The method of claim 9, wherein the resin is deposited onto the screen as an emulsion or onto a supporting film on the surface of the screen.

11. The method of claim 1, wherein the applying is accomplished by pressing the thixotropic paste through the screen using a material having a Shore A hardness of about 65 to 85 and having a right-angled edge.

12. The method of claim 11, wherein the right-angled edge is rounded or chamfered at 45°.

13. The method of claim 1, wherein the thixotropic paste has a silver content of at least 80% and wherein the electrically conducting tracks have a width between 0.1 and 0.25 mm.

14. A transparent substrate with electrically conductive tracks deposited thereon made according to the method of claim 1.

15. An automobile glazing panel, or portion thereof, comprising:
   a transparent substrate comprising electrically conducting tracks deposited on the substrate by screen printing, wherein the width of the electrically conducting tracks is less than or equal to 0.3 mm,
   two current busbars bounding said electrically conducting tracks, wherein at least a portion of the busbars have a width less than or equal to 0.3 mm and wherein applying a supply voltage of 11 to 14 volts to the busbars at a nominal power of 450 watts or less, under standard ambient temperature conditions, does not cause the temperature of the busbars to exceed 50° C.

* * * * *